United States Patent [19]
Farhang et al.

[11] Patent Number: 5,606,275
[45] Date of Patent: Feb. 25, 1997

[54] BUFFER CIRCUIT HAVING VARIABLE OUTPUT IMPEDANCE

[75] Inventors: Ali R. Farhang, Beaverton, Oreg.; Scott G. Nogle, Austin, Tex.

[73] Assignee: Motorola, Inc., Schaumburg, Ill.

[21] Appl. No.: 523,165

[22] Filed: Sep. 5, 1995

[51] Int. Cl.$^6$ .............................. H03K 19/084
[52] U.S. Cl. .......................... 327/108; 327/391
[58] Field of Search ................... 327/108, 389, 327/391, 112

[56] References Cited

U.S. PATENT DOCUMENTS

| | | | |
|---|---|---|---|
| 4,490,634 | 12/1984 | Hareyano | 327/388 |
| 5,055,847 | 10/1991 | Rybicki et al. | 341/162 |
| 5,134,311 | 7/1992 | Biber et al. | 307/270 |
| 5,379,230 | 1/1995 | Morikawa et al. | 327/108 |

*Primary Examiner*—Margaret Rose Wambach
*Attorney, Agent, or Firm*—Daniel D. Hill

[57] ABSTRACT

An output buffer circuit (20) has an output impedance that is adjustable. An external resistor (32) having a resistance that is a multiple of the desired output impedance is coupled to the output buffer circuit (20). A voltage across the resistor (32) is converted to a digital code using an analog-to-digital (A/D) converter (22). A digital code from the A/D converter (24) is used to adjust a resistance of a binary weighed transistor array (45) to match the resistance of the external resistor (32). A plurality of binary weighted output transistors (153, 154, 155) are selected in response to the digital code to adjust the output impedance to match the characteristic impedance of a load driven by the output buffer circuit (20). The output impedance is easily adjustable by changing the resistance of external resistor (32), allowing the output buffer circuit to drive various load impedances.

20 Claims, 6 Drawing Sheets

5,606,275

BUFFER CIRCUIT HAVING VARIABLE OUTPUT IMPEDANCE

FIELD OF THE INVENTION

This invention relates generally to circuits, and more particularly, to an output buffer circuit having a variable output impedance.

BACKGROUND OF THE INVENTION

In integrated circuits, such as microprocessors, memories, and the like, signals may be routed for relatively long distances using transmission lines. A transmission line may be a bus, a printed circuit board trace, or other type of relatively long metal line for transporting a digital signal. Typically, a printed circuit board trace has a characteristic impedance of between 50 and 75 ohms. The receiving end, or far end, of the transmission line is typically connected to an input of a logic circuit, where the input impedance is higher than the characteristic impedance of the transmission line. If the impedance coupled to the far end of the transmission line is different than the impedance of the transmission line, the signal may be reflected back to the sending end, causing the signal to overshoot a planned steady state voltage for the logic state. The signal may be reflected back and forth many times between the near end and the far end, causing oscillatory behavior of the signal at both ends. This repeated overshooting and undershooting of the signal is commonly known as "ringing", and results in reduced noise immunity and increased time for the signal to become, and remain, valid at the far end.

A driver circuit is used to provide enough current to "drive" a signal the length of the transmission line. A CMOS (complementary metal-oxide semiconductor) driver circuit commonly includes a P-channel transistor and an N-channel transistor connected in series between a positive power supply voltage terminal and a ground terminal. The gates of the transistors receive an input signal, and an output terminal of the driver circuit is located between the transistors. The P-channel transistor functions as a "pull-up" transistor, and the N-channel transistor functions as a "pull-down" transistor. The output impedance of the driver circuit should match the characteristic impedance of the transmission line in order for the driver circuit to absorb the reflected signal and prevent ringing. This would result in quieter waveforms, better noise immunity, and improved signal timing margins. However, the load impedance that a driver circuit is required to drive may vary, depending on the particular application in which the driver circuit is installed.

GTL (Gunning Transceiver Logic) is a logic type that is becoming increasingly popular. GTL has a logic swing that is comparable to the well known ECL (emitter-coupled logic) logic type. However, GTL has relatively low power consumption, high speed, and can be implemented with a CMOS process. In integrated circuits using logic levels having relatively small logic swings, such as GTL levels, even a small amount of ringing can result in significantly reduced noise immunity. Also, the signal timing margins as compared to, for example CMOS logic levels, may be significantly impaired.

DESCRIPTION OF A PREFERRED EMBODIMENT

Generally, the present invention provides an output buffer circuit having an adjustable output impedance. An external resistor is coupled between an input of the output buffer circuit and a power supply voltage terminal that is coupled to ground. The resistor has a resistance that is a multiple of the desired output impedance of the output buffer. The output impedance is adjusted by converting a sensed voltage level across the resistor to a digital code using an analog-to-digital (A/D) converter. The A/D converter includes a comparator for providing a digital signal to a binary counter. The binary counter counts up or down in response to the digital signal from the comparator to adjust a resistance of a binary weighed transistor array to match the resistance of the external resistor. The digital code from the counter is also provided to adjust the impedance of an output driver having a plurality of binary weighted pull-up transistors and binary weighted pull-down transistors. In the illustrated embodiment, there is a pull-up A/D converter and binary counter for the plurality of pull-up transistors and a pull-down A/D converter and binary counter for the plurality of pull-down transistors. The counters provide a digital code to select one or more of the binary weighted pull-up transistors and binary weighted pull-down transistors to adjust the drive strength and impedance of the pull-up transistors and the pull-down transistors to match the characteristic impedance of a load, such as a transmission line, coupled to an output node of the output buffer circuit.

Matching the impedance of the output buffer circuit to the characteristic impedance of the load allows reflected signals to be absorbed, thus preventing ringing. This results in quieter waveforms, better noise immunity, and improved signal timing margins. Also, the output impedance of the output buffer circuit is easily adjustable by changing the resistance value of the external resistor, allowing an integrated circuit, such as an integrated circuit memory incorporating the output buffer circuit, to drive various load impedances. Also, the A/D converter uses feedback to compensate for changes in die temperature and supply voltage.

Figure 1:
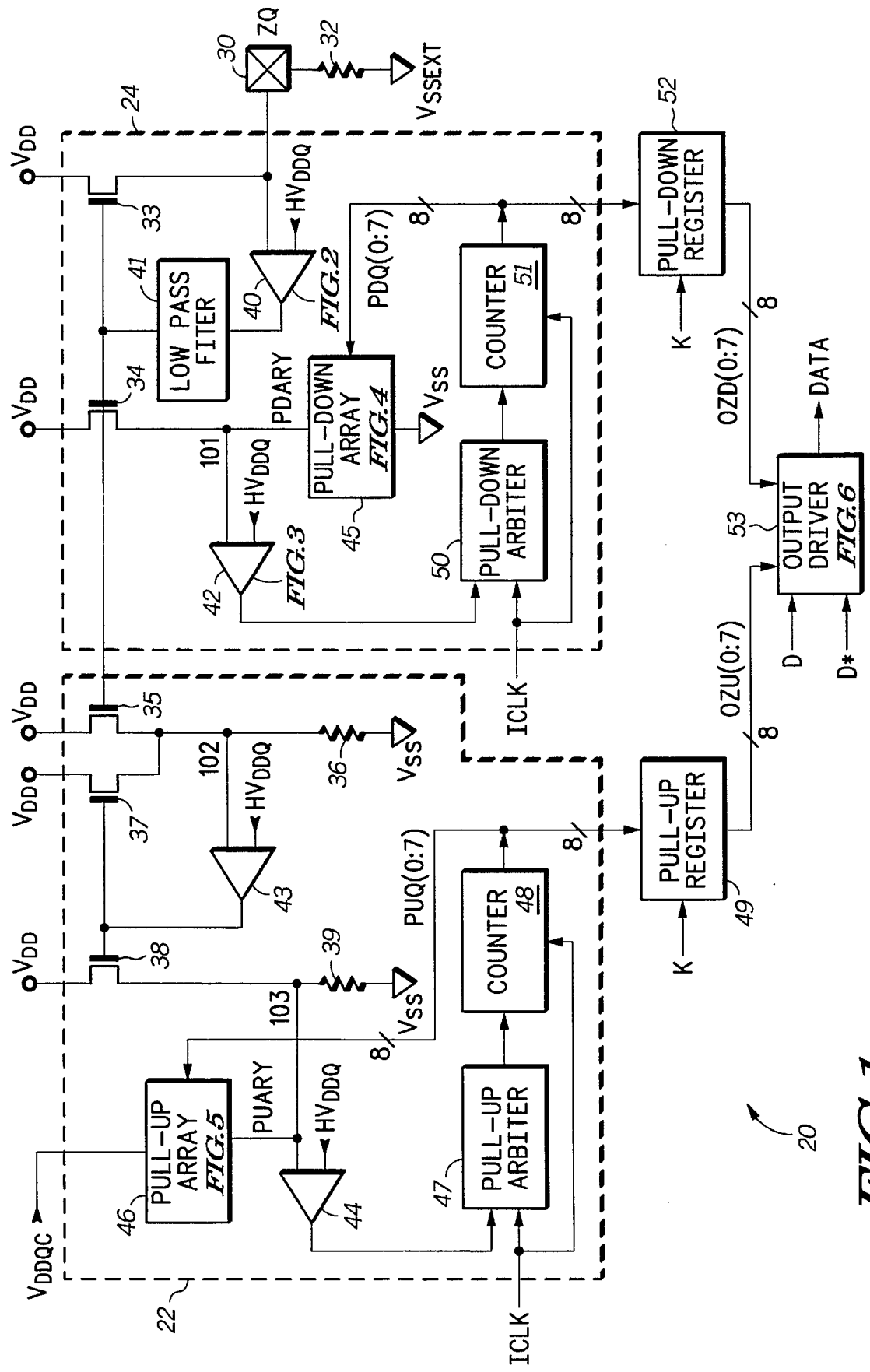
FIG. 1 illustrates, in partial block diagram form, partial schematic diagram form, and partial logic diagram form, an output buffer circuit having variable output impedance in accordance with one embodiment of the present invention.

The present invention can be more fully described with reference to FIGS. 1–6. FIG. 1 illustrates, in partial block diagram form, partial schematic diagram form, and partial logic diagram form, output buffer circuit 20 having variable output impedance in accordance with one embodiment of the present invention. Output buffer circuit 20 includes pull-up A/D converter 22, pull-down A/D converter 24, pull-up register 49, pull-down register 52, and output driver 53. Pull-up A/D converter 22 includes N-channel source-follower transistors 35, 37, and 38, resistors 36 and 39, feedback amplifier 43, comparator 44, binary weighted pull-up transistors array 46, pull-up arbiter 47, and 8-bit binary counter 48. Pull-down A/D converter 24 includes N-channel source-follower transistors 33, and 34, feedback amplifier 40, low pass filter 41, comparator 42, binary weighted pull-down transistor array 45, pull-down arbiter 50, and 8-bit binary counter 51.

In pull-down A/D converter 24, N-channel source-follower transistor 33 has a drain (current electrode) connected to a power supply voltage terminal labeled "$V_{DD}$", a gate (control electrode), and a source (current electrode) connected to a pad 30 for receiving a voltage labeled "ZQ". A resistor 32 has a first terminal connected to pad 30, and a second terminal connected to a power supply voltage terminal labeled "$V_{SSEXT}$". Feedback amplifier 40 has a first input terminal connected to pad 30, a second input terminal for receiving a reference voltage labeled "$HV_{DDQ}$", and an output terminal. Low pass filter 41 has an input terminal connected to the output terminal of feedback amplifier 40, and an output terminal connected to the gate of N-channel transistor 33. N-channel transistor 34 has a drain connected to $V_{DD}$, a gate connected to the gate of N-channel transistor 33, and a source connected to node 101. Comparator 42 has a first input terminal connected to the source of N-channel transistor 34, a second input terminal for receiving reference voltage $HV_{DDQ}$, and an output terminal. Pull-down arbiter 50 has a first input terminal connected to the output terminal of comparator 42, a second input terminal for receiving a clock signal labeled "ICLK", and an output terminal. 8-bit binary counter 51 has a first input terminal connected to the output terminal of pull-down arbiter 50, a second input terminal for receiving clock signal ICLK, and a plurality of output terminals for providing a digital count value labeled "PDQ(0:7)". Pull-down transistor array 45 has a plurality of input terminals connected to the plurality of output terminals of counter 51, and an output terminal connected to the first input terminal of comparator 42 for providing a pull-down array voltage labeled "PDARY".

In pull-up A/D converter 22, N-channel source-follower transistor 35 has a drain (current electrode) connected to $V_{DD}$, a gate (control electrode) connected to the gate of N-channel transistor 34, and a source (current electrode) connected to node 102. N-Channel source-follower transistor 37 has a drain connected to $V_{DD}$, a gate, and a source connected to the source of N-channel transistor 35 at node 102. Resistor 36 has a first terminal connected to the sources of N-channel transistors 35 and 37, and a second terminal connected to a power supply voltage terminal labeled "$V_{SS}$". Feedback amplifier 43 has a first input terminal connected to the sources of N-channel transistors 35 and 37, a second input terminal for receiving reference voltage $HV_{DDQ}$, and an output terminal connected to the gate of N-channel transistor 37. N-channel source-follower transistor 38 has a drain connected to $V_{DD}$, a gate connected to the gate of N-channel transistor 37, and a source connected to node 103. Resistor 39 has a first terminal connected to the source of N-channel transistor 38 at node 103, and a second terminal connected to $V_{SS}$. Comparator 44 has a first input terminal connected to the source of N-channel transistor 38, a second input terminal for receiving $HV_{DDQ}$, and an output terminal. Pull-up array 46 has an input terminal for receiving a voltage labeled "$V_{DDQC}$", a plurality of input terminals for receiving a digital count value labeled "PUQ(0:7)", and an output terminal connected to the first input terminal of comparator 44. Pull-up arbiter 47 has a first input terminal connected to the output terminal of comparator 44, a second input terminal for receiving clock signal ICLK, and an output terminal. Eight-bit binary counter 48 has a first input terminal connected to the output terminal of pull-up arbiter 47, a second input terminal for receiving clock signal ICLK, and a plurality of output terminals for providing digital count value PUQ(0:7).

Pull-down register 52 has a plurality of input terminals connected to the plurality of output terminals of counter 51, an input terminal for receiving a clock signal labeled "K", and a plurality of output terminals for providing pull-down registered digital count value labeled "OZD(0:7)". Pull-up register 49 has a plurality of input terminals connected to the plurality of output terminals of counter 48, an input terminal for receiving clock signal K, and a plurality of output terminals for providing pull-up registered digital count value labeled "OZU(0:7)". Output driver 53 has a first plurality of input terminals connected to the plurality of output terminals of pull-up register 49, a second plurality of input terminals connected to the plurality of output terminals of pull-down register 52, a first input terminal for receiving a data signal labeled "D", a second input terminal for receiving a data signal labeled "D*", and an output terminal for providing an output signal labeled "DATA". Data signals D and D* are differential data signals.

Output buffer circuit 20 uses the analog-to-digital (A/D) converters to convert a voltage to a digital code. The digital code is used to adjust the output drive strength of both of the pull-up and pull-down transistors of the output driver in order to adjust the output impedance of output buffer circuit 20 to match the impedance of a load that is driven by output buffer circuit 20. Resistor 32 is an external resistor and is coupled to an input terminal of output buffer circuit 20. The resistor has a resistance that is selected to be a multiple of the desired output impedance of the output buffer. For example, if the transmission line impedance is 50 ohms, the resistance of resistor 32 may be 5 times 50, or 250 ohms.

In operation, output buffer circuit 20 drives a load, such as a transmission line, at GTL levels in response to an input data signal. The output impedance of output driver 53 is adjusted by converting a sensed voltage level across external resistor 32 to a digital code. The digital code selects at least one of a plurality of binary weighted pull-up transistors and at least one of a plurality of binary weighted pull-down transistors to adjust the drive strength of output driver 53 (see FIG. 6). The pull-up drive strength is set using pull-up A/D converter 22 to select among the plurality of binary weighted pull-up transistors of output driver 53. The pull-down drive strength is set using pull-down A/D converter 24 to select among the plurality of binary weighted pull-down transistors of output driver 53.

Feedback amplifier 40, low pass filter 41, and N-channel transistor 33 are used to match the voltage at the first input terminal of feedback amplifier 40 to reference voltage $HV_{DDQ}$. By setting the voltage at the input terminal of feedback amplifier 40 to reference voltage $HV_{DDQ}$, a relatively constant current through N-channel transistor 33 causes a relatively constant current through N-channel transistor 34. The current through N-channel transistor 34 to pull-down array 45 produces a voltage at node 101. The voltage PDARY at node 101 is provided to the first input terminal of comparator 42. Comparator 42 performs a relative magnitude comparison of voltage PDARY to reference voltage $HV_{DDQ}$. If the voltage at node 101 is greater than reference voltage $HV_{DDQ}$, a logic high output signal from comparator 42 is provided to pull-down arbiter 50 to cause counter 51 to increase the value of PDQ(0:7) by one. This reduces the resistance of pull-down array 45, thus reducing the magnitude of voltage PDARY. Counter 51 counts up until a resistance value is reached in pull-down array 45 that matches the resistance of resistor 32 within a predetermined tolerance range. Binary counter 50 is a synchronous counter.

Therefore pull-down arbiter 50 is used to synchronize the signal received by counter 51 with clock signal ICLK. In other embodiments, if the binary counters are not synchronous, then arbiters 47 and 50 are not needed.

If voltage PDARY is still greater than voltage $HV_{DDQ}$, the output signal of comparator 42 is a logic high voltage causing counter 51 to count up by one, reducing the resistance of pull-down array 45, thus reducing voltage PDARY. The output bits of counter 51 are provided to pull-down array 45 to reduce the resistance of pull-down array 45. The digital value of PDQ(0:7) is also provided to pull-down register 52. In response to clock signal K, pull-down register 52 provides the registered count value OZD(0:7) to adjust the output impedance of the pull-down transistors. Registered count value OZD(0:7) corresponds to the count value PDQ(0:7). Comparator 42 continues to compare PDARY to $HV_{DDQ}$ until voltage PDARY is equal to reference voltage $HV_{DDQ}$.

Conversely, if the voltage node 101 is less than reference voltage $HV_{DDQ}$, a logic low output signal from comparator 42 is provided to pull-down arbiter 50 to cause counter 51 to decrease the value of PDQ(0:7) by one. This increases the resistance of pull-down array 45, thus increasing the magnitude of voltage PDARY. Counter 51 counts down until a resistance value is reached in pull-down array 45 that matches the resistance of resistor 32 within a predetermined tolerance range. Note that binary counters 48 and 51 are conventional 8 bit synchronous counters that can count up and down between binary numbers 00000000 and 11111111, but do not wrap around when the upper and lower limits are reached.

Also, note that because output buffer circuit 20 drives an output data signal at GTL levels, reference voltage $HV_{DDQ}$ is about one half of the power supply voltage provided to $V_{DDQ}$. $V_{DDQ}$ is the power supply terminal for output driver 53. If $V_{DD}$ is at 3.0 volts, $V_{DDQ}$ is at 1.2 volts and $HV_{DDQ}$ is at about 0.6 volts. $V_{DDQC}$ is a low pass filtered version of $V_{DDQ}$ and is therefore equal to about 1.2 volts. In other embodiments, the power supplies and reference voltage levels may be different.

At the same time that the pull-down A/D converter 24 is adjusting the drive strength of the plurality of pull-down transistors of output driver 53, pull-up A/D converter 22 is adjusting the drive strength of the plurality of pull-up transistors of output driver 53. Pull-up A/D converter 22 operates similarly to pull-down A/D converter 24. A current through N-channel transistors 35 and 37 causes a predetermined voltage drop across resistor 36. The resulting predetermined voltage at node 102 is provided to the first input terminal of feedback amplifier 43.

Feedback amplifier 43 compares the voltage at node 102 to reference voltage $HV_{DDQ}$, and provides an output signal to the gates of N-channel transistors 37 and 38 to adjust the voltage at node 102 to be approximately equal to reference voltage $HV_{DDQ}$. Feedback amplifier 43 is similar to feedback amplifier 40, illustrated in FIG. 2. The current through N-channel transistor 37 causes a relatively constant current through N-channel transistor 38, thereby producing a voltage drop across resistor 39 at node 103. Resistors 36 and 39 are matched resistors, and the resistance values of resistors 36 and 39 are approximately equal in the illustrated embodiment. The values of resistors 36 and 39 are chosen so that N-channel transistor 37 will drive enough current to set node 102 equal to reference voltage $HV_{DDQ}$ for all operating conditions and all process corners. The voltage at node 103, labeled "PUARY" is a function of the voltage drop across binary weighted pull-up array 46 and resistor 39, and is provided to the first input terminal of comparator 44. The current driven by pull-up array 46 must drive the same current as N-channel transistor 35 in order for voltage PUARY to match reference voltage $HV_{DDQ}$. Comparator 44 compares voltage PUARY to reference voltage $HV_{DDQ}$, and in response, provides a digital count signal to binary counter 48 via arbiter 47. Comparator 44 is similar to comparator 42, which is illustrated in FIG. 3.

If voltage PUARY is greater than reference voltage $HV_{DDQ}$, comparator 44 provides a logic high voltage to cause counter 48 to count down. Digital count value PUQ(0:7) is provided to pull-up array 46 to increase the effective resistance of pull-up array 46, thus reducing the magnitude of voltage PUARY. Digital count value PUQ(0:7) is also provided to pull-up register 49. Register 49 provides registered digital count value OZU(0:7), in response to clock signal K, to the plurality of pull-up transistors of output driver 53 to adjust the pull-up output impedance of output driver 53. The pull-up impedance is matched when voltage PUARY is equal to reference voltage $HV_{DDQ}$.

If voltage PUARY is less than reference voltage $HV_{DDQ}$, comparator 44 provides a logic low voltage to counter 48 through pull-up arbiter 47 to cause binary counter 48 to count up, decreasing the effective resistance of pull-up array 46, and increasing voltage PUARY by an incremental amount. Digital count value PUQ(0:7) is incremented, and the corresponding registered digital count value OZU(0:7) is incremented in response to clock signal K. The registered digital count value OZU(0:7) is provided to output driver 53 to adjust the impedance of the plurality of binary weighted pull-up transistors of output driver 53. As discussed above, output driver 53 is for providing a signal at GTL levels. GTL has a logic swing that is comparable to ECL (emitter-coupled logic) The logic high level voltage for GTL may equal between 1.14 and 1.26. The logic low level voltage may equal zero volts. In other embodiments, output driver 53 may provide a signal at other logic levels, such as CMOS, ECL, or TTL (transistor-transistor logic).

Since output buffer circuit 20 is intended to operate in a system using relatively small swing logic levels, it is especially important to reduce the effects of noise. Low pass filter 41 filters out high frequency noise between internal power supply voltage terminal $V_{SS}$ and external power supply voltage terminal $V_{SSEXT}$, where $V_{SS}$ is the internal ground and $V_{SSEXT}$ is connected to the external ground. The high frequency noise is introduced by the gate voltages of N-channel transistors 33, 34, and 35, and by other sources, such as from other circuits on the integrated circuit. Low pass filter 41 also adds stability to the feedback loop between the output terminal of feedback amplifier 40 to the first input terminal of feedback amplifier 40. In addition, the feedback provided by feedback amplifiers 40 and 43 also compensates for changes in die temperature and supply voltage that can affect the current through N-channel transistors 33, 34, 35, 37, and 38. Note that in the illustrated embodiment, resistor 32 is connected to an external ground through $V_{SSEXT}$. However, in other embodiments, resistor 32 may be coupled between pad 30 and another pad (not shown) for coupling resistor 32 to the internal ground ($V_{SS}$), thus eliminating the $V_{SS}$ to $V_{SSEXT}$ noise problem. Power supply noise at $V_{DDQC}$ and reference voltage $HV_{DDQ}$ is filtered out passing $V_{DDQ}$ through a low pass filter (not shown) and a unity gain amplifier (not shown) in a circuit used for converting $V_{DDQ}$ into $V_{DDQC}$ and $HV_{DDQ}$.

Internal $V_{DD}$ noise is reduced by utilizing N-channel transistors 33, 34, 35, 37, and 38 in a source-follower configuration instead of using P-channel transistors connected as current mirrors. If the drain voltage $V_D$ of an N-channel transistor in a source-follower configuration is less than the gate voltage $V_G$ minus a threshold voltage $V_T$, then modulation in $V_G$ will cause modulation in the source voltage $V_S$, and the N-channel transistor will have relatively poor power supply noise rejection. However, if $V_D$ is greater than $V_G$ minus $V_T$, then a modulation in $V_D$ will be rejected by the source, resulting in relatively good power supply noise rejection. Therefore, N-channel transistors 33, 34, 35, 37, and 38 operate with $V_D$ greater than $V_G$-$V_T$. Note that the body ties (not shown) for N-channel transistors 33, 34, 35, 37, and 38 are connected to $V_{SS}$ to further reduce $V_G$-$V_T$.

Figure 2:
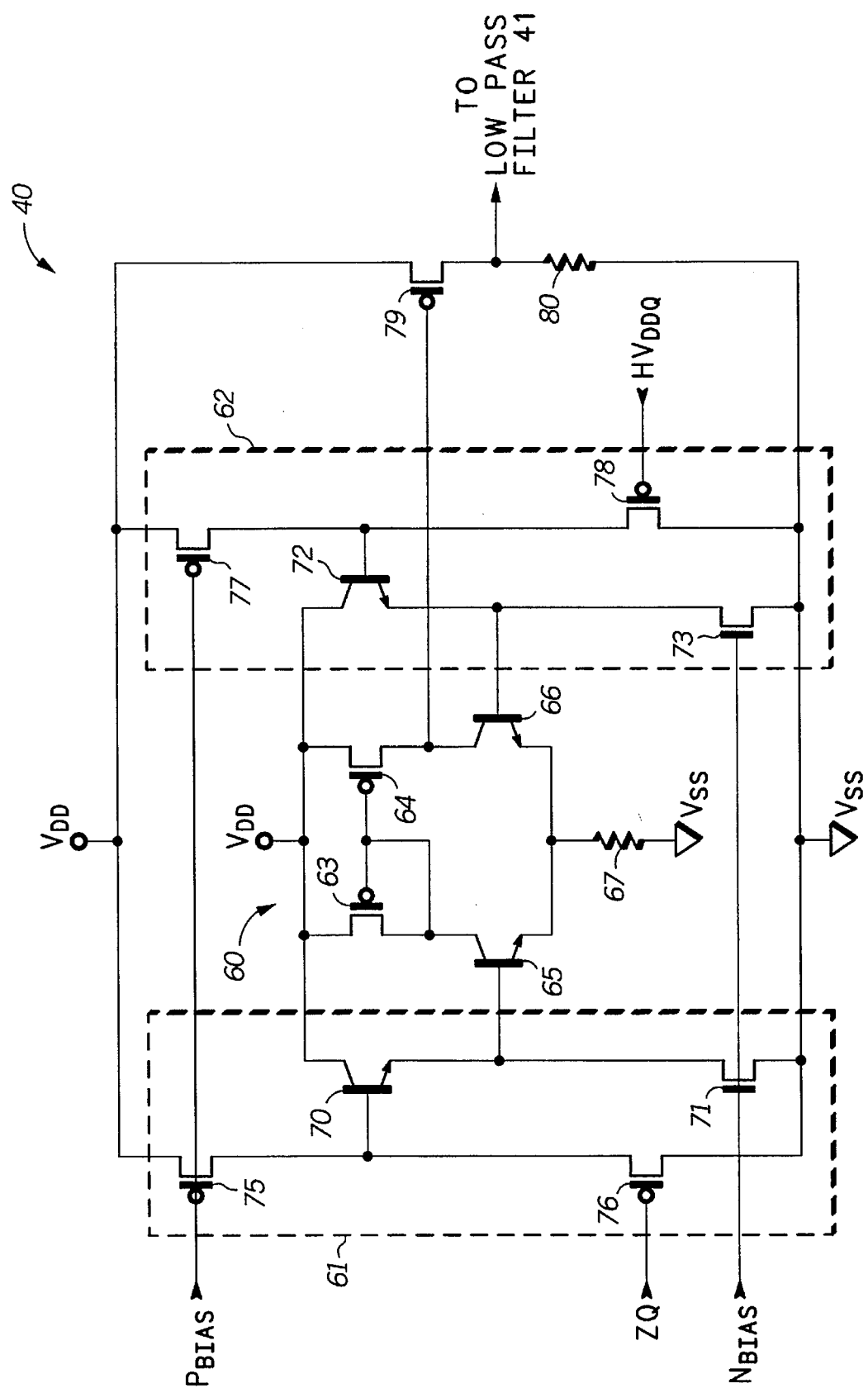
FIG. 2 illustrates, in schematic diagram form, the feedback amplifier of the pull-down A/D converter of FIG. 1.
Figure 3:
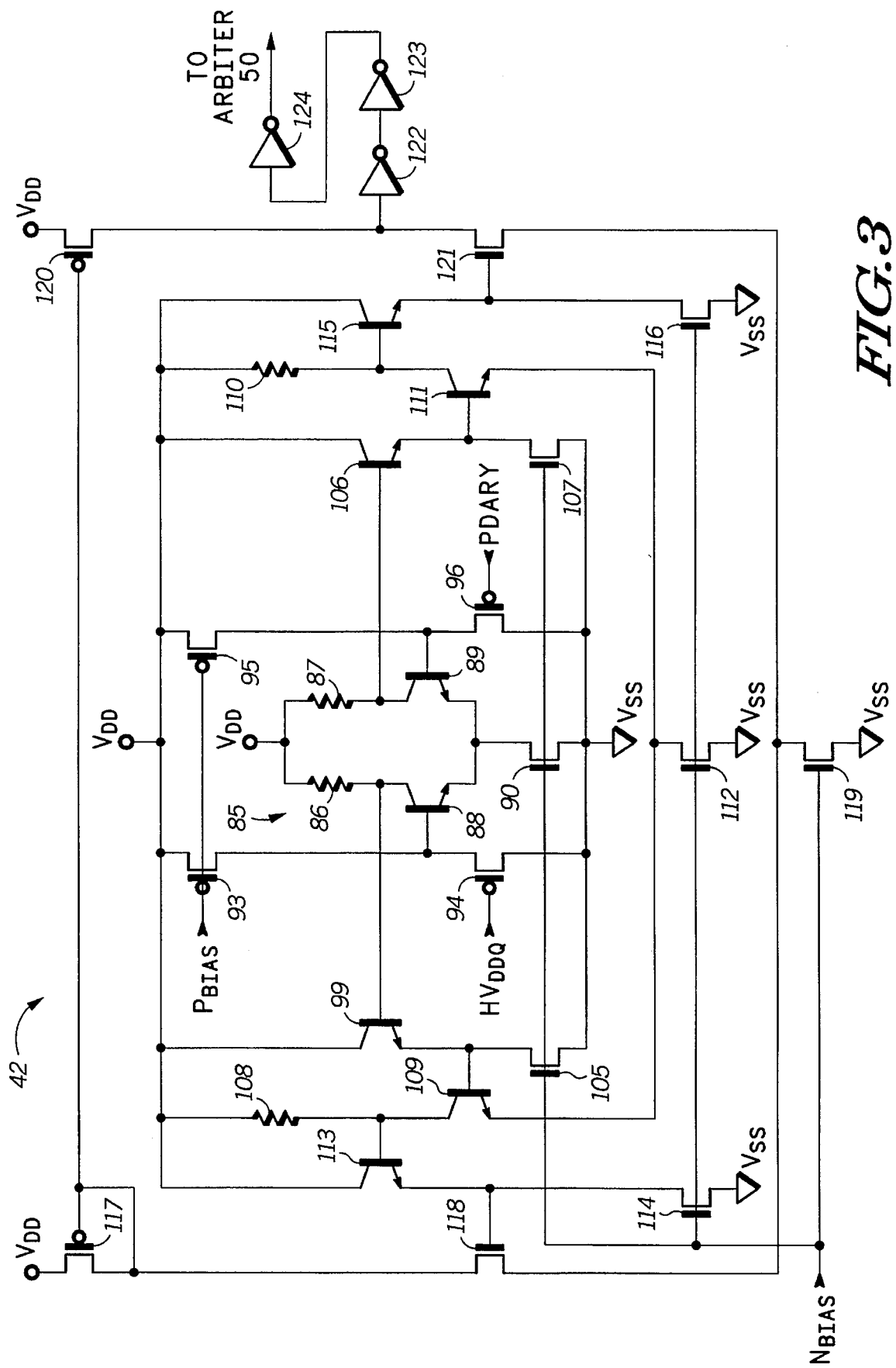
FIG. 3 illustrates, in schematic diagram form, the comparator of the pull-down A/D converter of FIG. 1.

FIG. 2 illustrates, in schematic diagram form, feedback amplifier 40 of FIG. 1. Feedback amplifier 40 includes differential amplifier 60, level shifting circuits 61 and 62, P-channel transistor 79, and resistor 80. Differential amplifier 60 includes P-channel transistors 63 and 64, NPN transistors 65 and 66, and resistor 67. Level shifting circuit 61 includes P-channel transistors 75 and 76, NPN transistor 70, and N-channel transistor 71. Level shifting circuit 62 includes P-channel transistors 77 and 78, NPN transistor 72, and N-channel transistor 73.

P-channel transistor 63 has a source connected to $V_{DD}$, and a gate and a drain connected together. P-channel transistor 64 has a source connected to $V_{DD}$, a gate connected to the gate of P-channel transistor 63, and a drain. NPN transistor 65 has a collector connected to the drain of P-channel transistor 63, a base, and an emitter. NPN transistor 66 has a collector connected to the drain of P-channel transistor 64, a base, and an emitter connected to the emitter of NPN transistor 65. Resistor 67 has a first terminal connected to the emitters of NPN transistors 65 and 66, and a second terminal connected to $V_{SS}$. NPN transistor 70 has a collector connected to $V_{DD}$, a base, and an emitter connected to the base of NPN transistor 65. N-channel transistor 71 has a drain connected to the emitter of NPN transistor 70, a gate for receiving bias voltage $N_{BIAS}$, and a source connected to $V_{SS}$. NPN transistor 72 has a collector connected to $V_{DD}$, a base, and an emitter connected to the base of NPN transistor 66. N-channel transistor 73 has a drain connected to the emitter of NPN transistor 72, a gate for receiving bias voltage $N_{BIAS}$, and a source connected to $V_{SS}$. P-channel transistor 75 has a source connected to $V_{DD}$, a gate for receiving bias voltage $P_{BIAS}$, and a drain connected to the base of NPN transistor 70. N-channel transistor 76 has a source connected to the drain of P-channel transistor 75, a gate for receiving voltage ZQ, and a drain connected to $V_{SS}$. P-channel transistor 77 has a source connected to $V_{DD}$, a gate for receiving bias voltage $P_{BIAS}$, and a drain connected to the base of NPN transistor 72. P-channel transistor 78 has a source connected to the drain of P-channel transistor 77, a gate for receiving reference voltage $HV_{DDQ}$, and a drain connected to $V_{SS}$. P-channel transistor 79 has a source connected to $V_{DD}$, a gate connected to the collector of NPN transistor 66, and a drain connected to the input terminal of low pass filter 41 (FIG. 1). Resistor 80 has a first terminal connected to the drain of P-channel transistor 79, and a second terminal connected to $V_{SS}$.

Bias voltage $P_{BIAS}$ is provided to the gates of P-channel transistors 75 and 77 to cause P-channel transistors 75 and 77 to function as relatively constant current sources. Likewise, bias voltage $N_{BIAS}$ is provided to the gates of N-channel transistors 71 and 73 to cause N-channel transistors 71 and 73 to function as relatively constant current sources.

In operation, feedback amplifier 40 compares voltage ZQ to reference voltage $HV_{DDQ}$ and in response, provides an output voltage to low pass filter 41. Level shifting circuits 61 and 62 level shift voltages ZQ and $HV_{DDQ}$, respectively, to levels that can be used by differential amplifier 60. Differential amplifier 60 is a conventional differential amplifier using P-channel transistors 63 and 64 as load elements. When voltage ZQ is lower than reference voltage $HV_{DDQ}$, more current is steered through NPN transistor 66 than through NPN transistor 65, and differential amplifier 60 provides a low voltage to the gate of P-channel transistor 79, causing P-channel transistor 79 to be more conductive. The drain of P-channel transistor 79 provides a high voltage to the input terminal of low pass filter 41 (shown in FIG. 1). Resistor 80 provides a level shifting function for the drain voltage of N-channel transistor 79. The gate voltage of N-channel transistor 33 (FIG. 1) is increased, increasing the drain-to-source current of N-channel transistor 33, thereby raising the voltage level of voltage ZQ until voltage ZQ is approximately equal to reference voltage $HV_{DDQ}$.

If voltage ZQ is higher than reference voltage $HV_{DDQ}$, more current is steered through NPN transistor 65 than through NPN transistor 66, and differential amplifier 60 provides a relatively high voltage to the gate of P-channel transistor 79, causing P-channel transistor 79 to be substantially non-conductive. The drain of P-channel transistor 79 provides a low voltage to the input terminal of low pass filter 41. The gate voltage of N-channel transistor 33 is decreased, decreasing the drain-to-source current of N-channel transistor 33, thereby reducing the voltage level of voltage ZQ until voltage ZQ is approximately equal to reference voltage $HV_{DDQ}$.

FIG. 3 illustrates, in schematic diagram form, comparator 42 of FIG. 1. Comparator 42 includes differential amplifier 85, P-channel transistors 93, 94, 95, 96, 117, and 120, N-channel transistors 105, 107, 112, 114, 116, 118, 119, and 121, NPN transistors 99, 106, 109, 111, 113, and 115, and inverters 122–124. Differential amplifier 85 includes resistors 86 and 87, NPN transistors 88 and 89, and N-channel transistor 90.

Resistor 86 has a first terminal connected to $V_{DD}$, and a second terminal. Resistor 87 has a first terminal connected to $V_{DD}$, and a second terminal. NPN transistor 88 has a collector connected to the second terminal of resistor 86, a base, and an emitter. NPN transistor 89 has a collector connected to the second terminal of resistor 87, a base, and an emitter connected to the emitter of NPN transistor 88. N-channel transistor 90 has a drain connected to the emitters of NPN transistors 88 and 89, a gate for receiving base voltage $N_{BIAS}$, and a source connected to $V_{SS}$. P-channel transistor 93 has a source connected to $V_{DD}$, a gate for receiving bias voltage $P_{BIAS}$, and a drain connected to the base of NPN transistor 88. P-channel transistor 94 has a source connected to the drain of P-channel transistor 93, a gate for receiving reference voltage $HV_{DDQ}$, and a drain connected to $V_{SS}$. P-channel transistor 95 has a source connected to $V_{DD}$, a gate for receiving bias voltage $P_{BIAS}$, and a drain connected to the base of NPN transistor 89. P-channel transistor 96 has a source connected to the drain of P-channel transistor 95, a gate for receiving pull-down array voltage PDARY, and a drain connected to $V_{SS}$. NPN transistor 99 has a collector connected to $V_{DD}$, a base connected to the collector of NPN transistor 88, and an emitter. N-channel transistor 105 has a drain connected to the emitter of NPN transistor 99, a gate for receiving bias voltage $N_{BIAS}$, and a source connected to $V_{SS}$. NPN transistor 106 has a collector connected to $V_{DD}$, a base connected to the collector of NPN transistor 89, and an emitter. N-channel transistor 107 has a drain connected to the emitter of NPN transistor 106, a gate connected for receiving bias voltage $N_{BIAS}$, and a source connected to $V_{SS}$.

Resistor 108 has a first terminal connected to $V_{DD}$, and a second terminal. NPN transistor 109 has a collector connected to the second terminal of resistor 108, a base connected to the emitter of NPN transistor 99, and an emitter. N-channel transistor 112 has a drain connected to the emitter of NPN transistor 109, a gate for receiving bias voltage $N_{BIAS}$, and a source connected to $V_{SS}$. Resistor 110 has a first terminal connected to $V_{DD}$, and a second terminal. NPN transistor 111 has a collector connected to the second terminal of resistor 110, a base connected to the emitter of NPN transistor 106, and an emitter connected to the drain of N-channel transistor 112. NPN transistor 113 has a collector connected to $V_{DD}$, a base connected to the collector of NPN transistor 109, and an emitter. N-channel transistor 114 has a drain connected to the emitter of NPN transistor 113, a gate for receiving bias voltage $N_{BIAS}$, and a source connected to $V_{SS}$. NPN transistor 115 has a collector connected to $V_{DD}$, a base connected to the collector of NPN transistor 111, and an emitter. N-channel transistor 116 has a drain connected to the emitter of NPN transistor 115, a gate for receiving bias voltage $N_{BIAS}$, and a source connected to $V_{SS}$. P-channel transistor 117 has a source connected to $V_{DD}$, and a gate and a drain connected together. N-channel transistor 118 has a drain connected to the gate and drain of P-channel transistor 117, a gate connected to the emitter of NPN transistor 113, and a source. N-channel transistor 119 has a drain connected to the source of N-channel transistor 118, a gate for receiving bias voltage $N_{BIAS}$, and a source connected to $V_{SS}$. P-channel transistor 120 has a source connected to $V_{DD}$, a gate connected to the gate of P-channel transistor 117, and a drain. N-channel transistor 121 has a drain connected to the drain of P-channel transistor 120, a gate connected to the emitter of NPN transistor 115, and a source connected to the drain of N-channel transistor 119. Inverters 122, 123, and 124 are connected in series between the drain of P-channel transistor 120 and the first input terminal of pull-down arbiter 50.

Bias voltage $P_{BIAS}$ is provided to the gates of P-channel transistors 93 and 95 to cause P-channel transistors 93 and 95 to function as relatively constant current sources. Likewise, bias voltage $N_{BIAS}$ is provided to the gates of N-channel transistors 90, 105, 107, 112, 114, 116, and 119 to cause N-channel transistors 90, 105, 107, 112, 114, 116, and 119 to function as relatively constant current sources.

In operation, comparator 42 operates similarly to feedback amplifier 40, and provides a digital signal to binary counter 51 via arbiter 50 to cause counter 51 to count up or to count down. If pull-down array voltage PDARY is higher than reference voltage $HV_{DDQ}$, the base voltage of NPN transistor 89 is relatively higher than the base voltage of NPN transistor 88, and more current is steered through NPN transistor 89 than through NPN transistor 88 of differential amplifier 85. The base voltage of NPN transistor 106 is reduced, causing the base voltage of NPN transistor 111 to be reduced. Resistors 108 and 110 function as load elements for a differential pair comprised of NPN transistors 109 and 111. The base voltage of NPN transistor 115 is increased, increasing the voltage at the gate of N-channel transistor 121. The voltage at the input terminal of inverter 122 is reduced to a logic low voltage, and series-connected inverters 122, 123, and 124 provide a buffered logic high voltage to arbiter 50. Differential amplifier 85 is a conventional differential amplifier having resistors 86 and 87 serving as the load elements.

If pull-down array voltage PDARY is lower than reference voltage $HV_{DDQ}$, the base voltage of NPN transistor 88 is higher than the base voltage of NPN transistor 89, and more current is steered through NPN transistor 88 than through NPN transistor 89 of differential amplifier 85. The base voltage of NPN transistor 106 is increased, causing the base voltage of NPN transistor 111 to increase. The base voltage of NPN transistor 115 is decreased, decreasing the gate voltage of N-channel transistor 121. The voltage at the input terminal of inverter 122 is increased to a logic high voltage, and series-connected inverters 122, 123, and 124 provide a buffered logic low voltage to arbiter 50.

Figure 4:
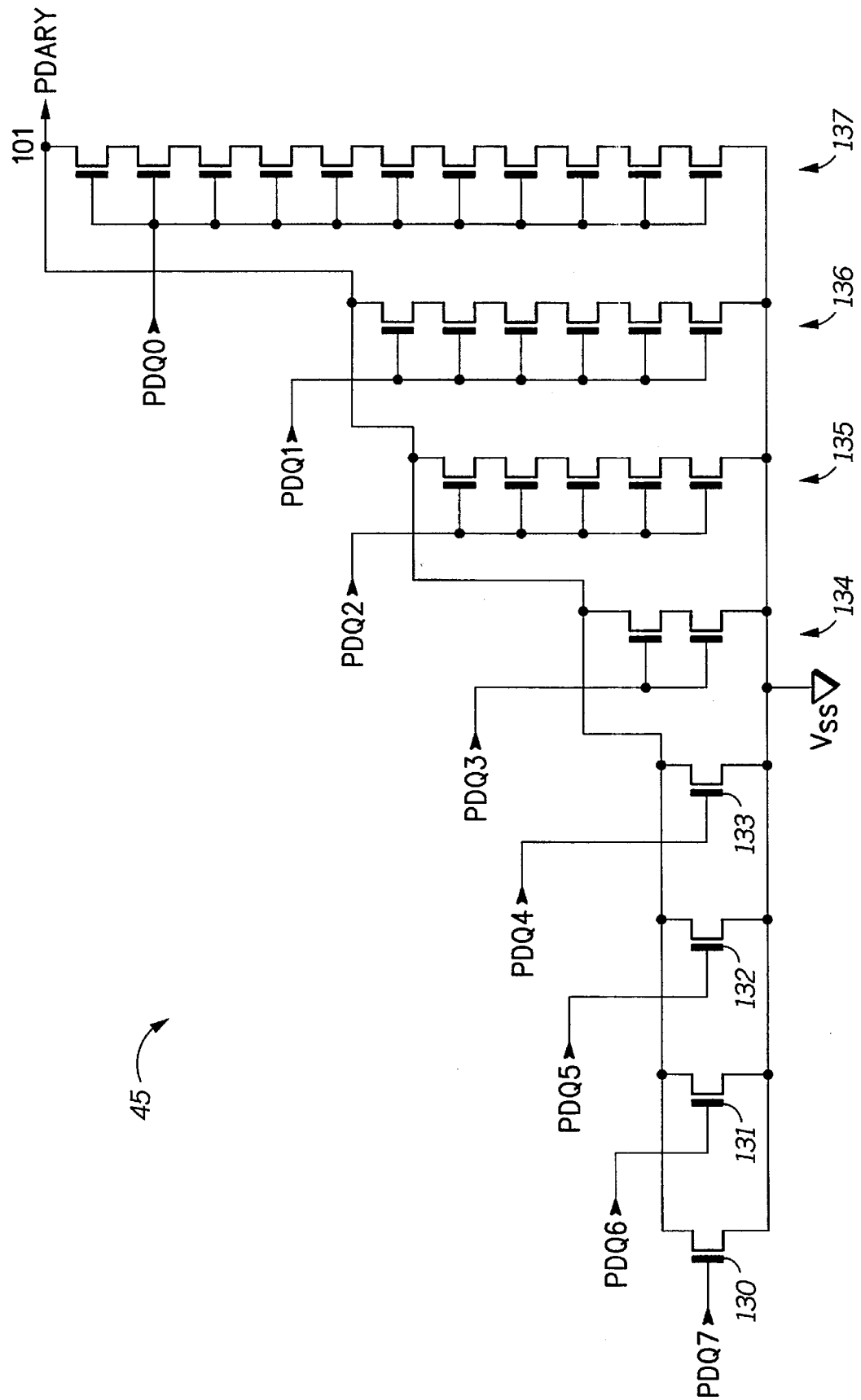
FIG. 4 illustrates, in schematic diagram form, the pull-down binary weighted transistor array of FIG. 1.

FIG. 4 illustrates, in schematic diagram form, pull-down binary weighted transistor array 45 of FIG. 1. Pull-down binary weighted transistor array 45 includes N-channel transistors 130, 131, 132, and 133, series connected N-channel transistors 134, series connected N-channel transistors 135, series connected N-channel transistors 136, and series connected N-channel transistors 137.

N-channel transistor 130 has a drain connected to node 101, a gate for receiving digital count value bit PDQ 7, and a source connected to $V_{SS}$. N-channel transistor 131 has a drain connected to node 101, a gate for receiving digital count value bit PDQ 6, and a source connected to $V_{SS}$. N-channel transistor 132 has a drain connected to node 101, a gate for receiving digital count value bit PDQ 5, and a source connected to $V_{SS}$. N-channel transistor 133 has a drain connected to node 101, a gate for receiving digital count value bit PDQ 4, and a source connected to $V_{SS}$. Series connected N-channel transistors 134 are connected between node 101 and $V_{SS}$. A gate of each of series connected N-channel transistors 134 is for receiving digital count value bit PDQ 3. Series connected N-channel transistors 135 are connected between node 101 and $V_{SS}$. A gate of each of series connected N-channel transistors 135 is for receiving digital count value bit PDQ 2. Series connected N-channel transistors 136 are connected between node 101 and $V_{SS}$. A gate of each of series connected N-channel transistors 136 is for receiving digital count value bit PDQ 1. Series connected N-channel transistors 137 are connected between node 101 and $V_{SS}$. A gate of each of series connected N-channel transistors 137 is for receiving digital count value bit PDQ 0. Node 101 provides pull-down array voltage PDARY as a function of the digital count value PDQ(0:7).

The N-channel transistors of pull-down binary weighted transistor array 45 are sized to provide an adjustable impedance between node 101 and $V_{SS}$ depending on the value of digital count value $PDQ_{(0:7)}$. The impedance between node 101 and $V_{SS}$ is decreased for an increasing digital count value, and is increased for a decreasing digital count value.

Figure 5:
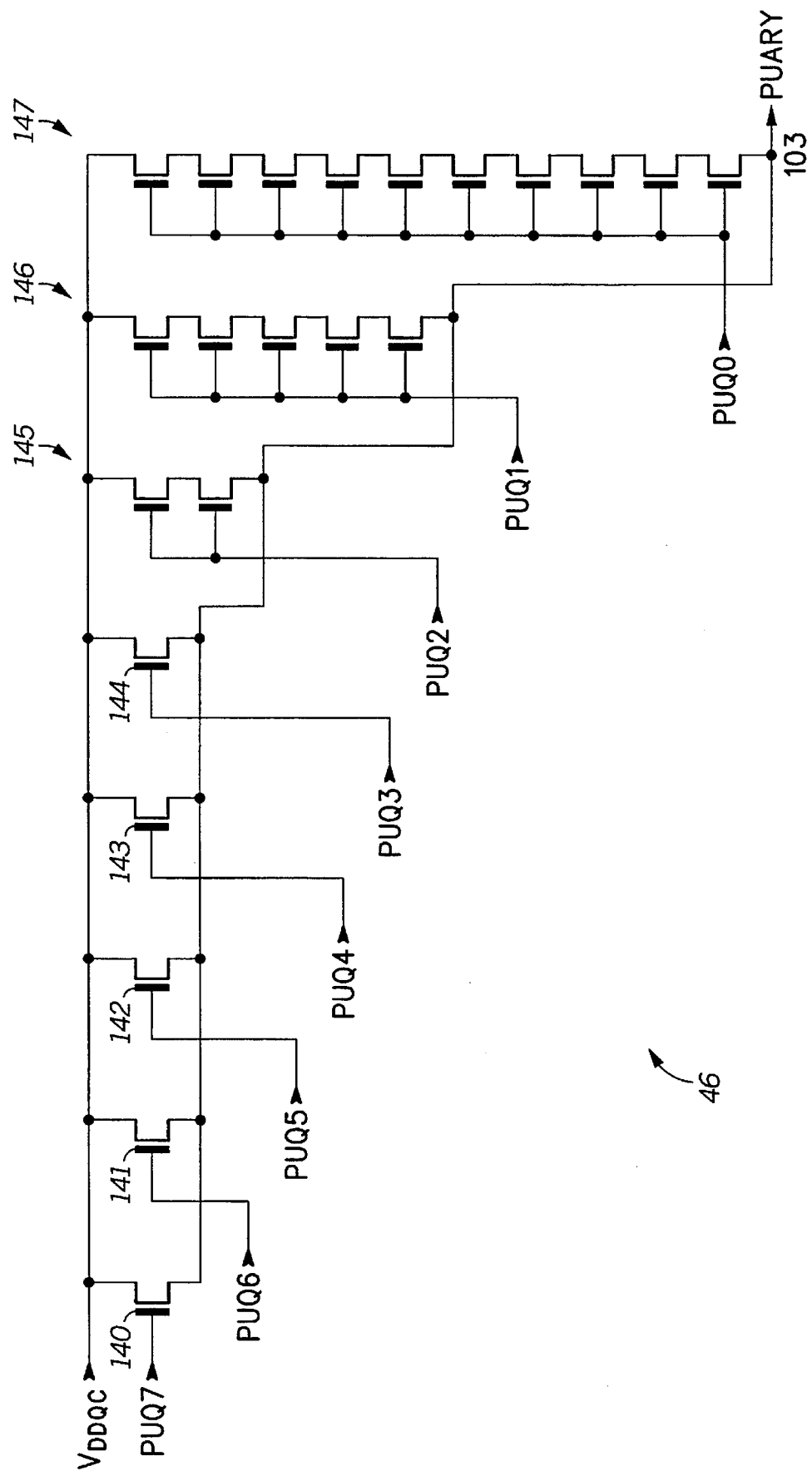
FIG. 5 illustrates, in schematic diagram form, the pull-up binary weighted transistor array of FIG. 1.

FIG. 5 illustrates, in schematic diagram form, pull-up binary weighted transistor array 46 of FIG. 1. Pull-up binary weighted transistor array 46 includes N-channel transistors 140, 141, 142, 143 and 144, series connected N-channel transistors 145, series connected N-channel transistors 146, and series connected N-channel transistors 147. N-channel transistor 140 has a drain connected to $V_{DDQC}$, a gate for receiving digital count value bit PUQ 7, and a source connected to node 103. N-channel transistor 141 has a drain connected to $V_{DDQC}$, a gate for receiving digital count value bit PUQ 6, and a source connected to node 103. N-channel transistor 142 has a drain connected to $V_{DDQC}$, a gate for receiving digital count value bit PUQ 5, and a source connected to node 103. N-channel transistor 143 has a drain connected to $V_{DDQC}$, a gate for receiving digital count value bit PUQ 4, and a source connected to node 103. N-channel transistor 144 has a drain connected to $V_{DDQC}$, a gate for receiving digital count value bit PUQ 3, and a source connected to node 103.

Series connected N-channel transistors 145 are connected between $V_{DDQC}$ and node 103. A gate of each of series connected N-channel transistors 145 is for receiving digital count value bit PUQ 2. Series connected N-channel transistors 146 are connected between $V_{DDQC}$ and node 103. A gate of each of series connected N-channel transistors 146 is for receiving digital count value bit PUQ 1. Series connected N-channel transistors 147 are connected between $V_{DDQC}$ and node 103. A gate of each of series connected N-channel transistors 147 is for receiving digital count value bit PUQ 0. Node 103 provides pull-up array voltage PUARY as a function of the digital count value PUQ(0:7).

The N-channel transistors of pull-up binary weighted transistor array 46 are sized to provide an adjustable impedance between $V_{DDQC}$ and node 101 depending of the value of digital count value PUQ(0:7). Like pull-down binary weighted transistor array 45, the impedance between $V_{DDQC}$ and node 101 is decreased for an increasing digital count value, and is increased for a decreasing digital count value.

Figure 6:
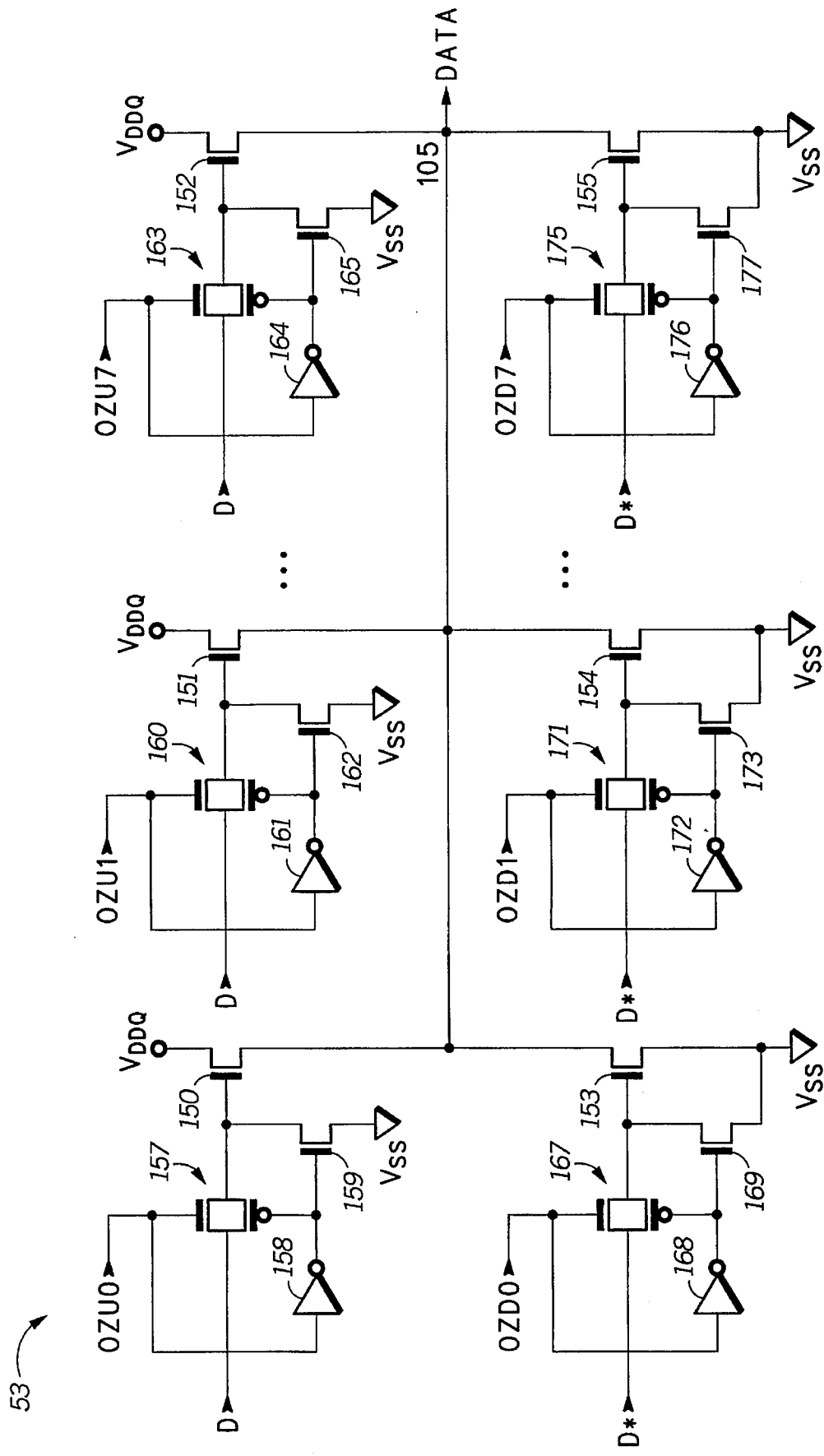
FIG. 6 illustrates, in partial schematic diagram form and partial logic diagram form, the output driver of FIG. 1.

FIG. 6 illustrates, in partial schematic diagram form and partial logic diagram form, output driver 53 of FIG. 1. Output driver 53 includes a plurality of N-channel pull-up transistors including N-channel transistors 150, 151, and 152, a plurality of N-channel pull-down transistors including N-channel transistors 153, 154, and 155, transmission gates 157, 160, 163, 167, 171, and 175, N-channel transistors 159, 162, 165, 169, 173, and 177, and inverters 158, 161, 164, 168, 172, and 176. N-channel pull-up transistors 150, 151, and 152 are representative of a plurality of binary weighted pull-up transistors for pulling up output data signal DATA in response to receiving input data signal D and pull-up control signals OZU(0:7). Pull-up control signals OZU(0:7) are used to match impedances with a load driven by the pull-up transistors of output driver 53. N-channel pull-down transistors 153, 154, and 155 are representative of a plurality of binary weighted pull-down transistors for pulling down output signal DATA in response to receiving input data signal D* and pull-down control signals OZD(0:7). Pull-down control signals OZD(0:7) are used to match impedances with a load driven by the pull-down transistors of output driver 53.

N-channel pull-up transistor 150 has a drain connected to $V_{DDQ}$, a gate for receiving input data signal D via transmission gate 157, and a source connected to output terminal 105. Pull-up control signal OZU 0 controls the conductivity of transmission gate 157. N-channel transistor 159 has a drain connected to the gate of N-channel transistor 150, a gate connected to an output terminal of inverter 158, and a source connected to $V_{SS}$.

N-channel pull-up transistor 151 has a drain connected to $V_{DDQ}$, a gate for receiving input data signal D via transmission gate 160, and a source connected to output terminal 105. Pull-up control signal OZU 1 controls the conductivity of transmission gate 160. N-channel transistor 162 has a drain connected to the gate of N-channel transistor 151, a gate connected to an output terminal of inverter 161, and a source connected to $V_{SS}$.

N-channel pull-up transistor 152 has a drain connected to $V_{DDQ}$, a gate for receiving input data signal D via transmission gate 163, and a source connected to output terminal 105. Pull-up control signal OZU 7 controls the conductivity of transmission gate 163. N-channel transistor 165 has a drain connected to the gate of N-channel transistor 152, a gate connected to an output terminal of inverter 164, and a source connected to $V_{SS}$.

N-channel pull-down transistor 153 has a drain connected to output terminal 105, a gate for receiving input data signal D* via transmission gate 167, and a source connected to $V_{SS}$. Pull-down control signal OZD 0 controls the conductivity of transmission gate 167. N-channel transistor 169 has a drain connected to the gate of N-channel-transistor 153, a gate connected to an output terminal of inverter 168, and a source connected to $V_{SS}$.

N-channel pull-down transistor 154 has a drain connected to output terminal 105, a gate for receiving input data signal D* via transmission gate 171, and a source connected to $V_{SS}$. Pull-down control signal OZD 1 controls the conductivity of transmission gate 171. N-channel transistor 173 has a drain connected to the gate of N-channel transistor 154, a gate connected to an output terminal of inverter 172, and a source connected to $V_{SS}$.

N-channel pull-down transistor 155 has a drain connected to output terminal 105, a gate for receiving input data signal D* via transmission gate 175, and a source connected to $V_{SS}$. Pull-down control signal OZD 7 controls the conductivity of transmission gate 175. N-channel transistor 177 has a drain connected to the gate of N-channel transistor 155, a gate connected to an output terminal of inverter 176, and a source connected to $V_{SS}$.

The transmission gates of output driver 53 function as coupling elements and are gated by the pull-up digital count values OZU(0:7) and pull-down digital count values $OZD_{(0:7)}$ to adjust the output impedance at node 105 to the impedance of the load coupled to node 105. Inverters 158, 161, 164, 168, 172, and 176 receive their corresponding digital count values and cause the P-channel transistors of the transmission gates to be conductive in response to the corresponding digital count value being a logic high voltage.

Matching the impedance of node 105 of output driver 53 to the impedance of the transmission line allows reflected signals to be absorbed, thus preventing ringing. This results in quieter waveforms, better noise immunity, and improved signal timing margin. Also, the impedance of node 105 is easily adjustable by changing the resistance value of resistor 32 (FIG. 1), allowing an integrated circuit, such as an integrated circuit memory incorporating output buffer circuit 20 to drive various load impedances.

While the invention has been described in the context of a preferred embodiment, it will be apparent to those skilled in the art that the present invention may be modified in numerous ways and may assume many embodiments other than that specifically set out and described above. For example, source follower N-channel transistors 33, 34, 35, 37, and 38 may be replaced with P-channel transistors in embodiments that are not as sensitive to noise. Also, pull-up register 49 and pull-down register 52 may be portions of one multi-bit register. In addition, the digital count values may be used to control the impedance of numerous output driver circuits on the integrated circuit. Accordingly, it is intended by the appended claims to cover all modifications of the invention which fall within the true spirit and scope of the invention.

What is claimed is:

1. A buffer circuit, comprising:
   an analog-to-digital converter having an input terminal for receiving a predetermined input voltage, and a plurality of output terminals for providing a digital code corresponding to a voltage level of the predetermined input voltage; and
   an output driver circuit having a plurality of binary weighted output transistors, each of the plurality of binary weighted output transistors having a first current electrode coupled to a power supply voltage terminal, a control electrode selectively coupled to receive a data signal in response to a predetermined logic state of a corresponding bit of the digital code, and a second current electrode coupled to an output terminal for providing an output signal.

2. The buffer circuit of claim 1, wherein the plurality of binary weighted output transistors are a plurality of binary weighted pull-up transistors and the power supply voltage terminal is for receiving a positive power supply voltage.

3. The buffer circuit of claim 1, wherein the plurality of binary weighted output transistors are a plurality of binary weighted pull-down transistors and the power supply voltage terminal is for coupling to ground.

4. The buffer circuit of claim 1, wherein the analog-to-digital converter comprises:

a comparator having an input terminal for receiving the predetermined input voltage, the comparator for comparing the predetermined input voltage to a reference voltage and providing a signal of a predetermined logic state in response to the comparator performing a relative magnitude comparison of the predetermined input voltage to the reference voltage;

a binary counter, coupled to an output terminal of the comparator for receiving the signal, and in response to the signal having a first predetermined logic state, the binary counter counting up to a count value, and in response to the signal having a second predetermined logic state, the binary counter counting down to the count value; and a binary weighted transistor array, coupled to an output of the binary counter and to a first voltage source, for providing a predetermined voltage in response to receiving the digital code, the predetermined voltage for adjusting a magnitude of the input voltage until the input voltage is approximately equal to the reference voltage.

5. The buffer circuit of claim 1, further comprising a resistive element operatively coupled between the input terminal and a second power supply voltage terminal, the resistive element having a resistance value that is a multiple of an output impedance of a load coupled to the output terminal of the output driver circuit.

6. The buffer circuit of claim 5, further comprising:

a feedback amplifier having a first input terminal coupled to a first terminal of the resistive element, a second input terminal for receiving a reference voltage, and an output terminal;

a low pass filter having an input terminal coupled to the output terminal of the feedback amplifier, and an output terminal;

a first transistor having a first current electrode coupled to a positive power supply voltage terminal, a control electrode coupled to the output terminal of the low pass filter, and a second current electrode coupled to the first input terminal of the feedback amplifier; and a second transistor having a first current electrode coupled to the positive power supply voltage terminal, a control electrode coupled to the output terminal of the low pass filter, and a second current electrode coupled to the input terminal of the analog-to-digital converter.

7. A buffer circuit having variable output impedance, comprising:

a resistive element coupled to an input terminal of the buffer circuit;

a first transistor having a first current electrode coupled to a power supply voltage terminal, a control electrode, and a second current electrode coupled to the input terminal of the buffer circuit;

a feedback amplifier having a first input terminal coupled to a first terminal of the resistive element, a second input terminal for receiving a reference voltage, and an output terminal coupled to the control electrode of the first transistor;

a second transistor having a first current electrode coupled to the power supply voltage terminal, a control electrode coupled to the output terminal of the feedback amplifier, and a second current electrode;

an analog-to-digital converter having an input terminal coupled to the second current electrode of the second transistor for receiving an input voltage, and a plurality of output terminals for providing a digital code corresponding to a voltage level of the input voltage; and an output driver circuit having a plurality of binary weighted transistors, each of the plurality of binary weighted transistors having a first current electrode coupled to a power supply voltage terminal, a control electrode selectively coupled to receive a data signal in response to a predetermined logic state of a corresponding bit of the digital code, and a second current electrode coupled to an output terminal of the output driver circuit for providing an output signal.

8. The buffer circuit of claim 7, wherein the plurality of binary weighted transistors are a plurality of binary weighted pull-up transistors and the power supply voltage terminal is for receiving a positive power supply voltage.

9. The buffer circuit of claim 8, further comprising:

a pull-down analog-to-digital converter having an input terminal for receiving the input voltage, and a plurality of output terminals for providing a pull-down digital code; and a plurality of binary weighted pull-down transistors, each of the plurality of binary weighted pull-down transistors having a first current electrode coupled to the output terminal for providing the output signal, a control electrode selectively coupled to receive an input signal in response to a predetermined logic state of a corresponding bit of the pull-down digital code, and a second current electrode coupled to a second power supply voltage terminal.

10. The buffer circuit of claim 9, wherein the pull-down analog-to-digital converter comprises:

a comparator having an input terminal for receiving the input voltage, the comparator for comparing the input voltage to a reference voltage and providing a signal of a predetermined logic state in response to the comparator performing a relative magnitude comparison of the input voltage to the reference voltage;

a binary counter, coupled to an output terminal of the comparator for receiving the signal, and in response to the signal having a first predetermined logic state, the binary counter counting up to a count value, and in response to the signal having a second predetermined logic state, the binary counter counting down to the count value; and a binary weighted pull-down transistor array, coupled to an output of the binary counter and to a first voltage source, for providing a predetermined voltage in response to receiving the digital code, the predetermined voltage for adjusting the magnitude of the input voltage until the input voltage is substantially equal to the reference voltage.

11. The buffer circuit of claim 7, wherein the plurality of binary weighted transistors are a plurality of binary weighted pull-down transistors and the power supply voltage terminal is for coupling to ground.

12. The buffer circuit of claim 7, wherein the analog-to-digital converter comprises:

a comparator having an input terminal for receiving the input voltage, the comparator for comparing the input voltage to a reference voltage and providing a signal of a predetermined logic state in response to the comparator performing a relative magnitude comparison of the input voltage to the reference voltage;

a binary counter, coupled to an output terminal of the comparator for receiving the signal, and in response to the signal having a first predetermined logic state, the binary counter counting up to a count value, and in response to the signal having a second predetermined logic state, the binary counter counting down to the count value; and a binary weighted pull-up transistor array, coupled to an output of the binary counter and to a first voltage source, for providing a predetermined voltage in response to receiving the digital code, the predetermined voltage for adjusting a magnitude of the input voltage until the input voltage is substantially equal to the reference voltage.

13. The buffer circuit of claim 7, wherein the resistive element is a resistor.

14. The buffer circuit of claim 7, wherein the output driver circuit further comprises a plurality of coupling elements, a coupling element of each of the plurality of coupling elements having an input terminal for receiving the data signal, an output terminal coupled to a gate of a corresponding transistor of the plurality of binary weighted transistors, and a control terminal for receiving the corresponding bit of the digital code.

15. A buffer circuit having variable output impedance, comprising:

a pull-up analog-to-digital converter having an input terminal for receiving a first predetermined input voltage, and a plurality of output terminals for providing a pull-up digital code corresponding to a voltage level of the first predetermined input voltage;

a pull-down analog-to-digital converter having an input terminal for receiving a second predetermined input voltage, and a plurality of output terminals for providing a pull-down digital code corresponding to a voltage level of the second predetermined input voltage; and an output driver circuit comprising:

a plurality of binary weighted pull-up transistors, each of the plurality of binary weighted pull-up transistors having a first current electrode coupled to a first power supply voltage terminal, a control electrode selectively coupled to receive a first data signal in response to a predetermined logic state of a corresponding bit of the pull-up digital code, and a second current electrode coupled to an output terminal for pulling up an output signal; and a plurality of binary weighted pull-down transistors, each of the plurality of binary weighted pull-down transistors having a first current electrode coupled to a second power supply voltage terminal, a control electrode selectively coupled to receive a second data signal in response to a predetermined logic state of a corresponding bit of the pull-down digital code, and a second current electrode coupled to the output terminal for pulling down the output signal.

16. The buffer circuit of claim 15, wherein the pull-down analog-to-digital converter comprises:

a comparator having an input terminal for receiving the second predetermined input voltage, the comparator for comparing the second predetermined input voltage to a reference voltage and providing a signal of a predetermined logic state in response to the comparator performing a relative magnitude comparison of the second predetermined input voltage to the reference voltage;

a binary counter, coupled to an output terminal of the comparator for receiving the signal, and in response to the signal having a first predetermined logic state, the binary counter counting up to a count value, and in response to the signal having a second predetermined logic state, the binary counter counting down to the count value; and a binary weighted pull-down transistor array, coupled to an output of the binary counter and to a first voltage source, for providing a predetermined voltage in response to receiving the pull-down digital code, the predetermined voltage for adjusting a magnitude of the input voltage until the input voltage is approximately equal to the reference voltage.

17. The buffer circuit of claim 16, further comprising:

a resistive element having a first terminal coupled to an input terminal of the buffer circuit, and a second terminal coupled to a ground terminal;

a first transistor having a first current electrode coupled to a power supply voltage terminal, a control electrode, and a second current electrode coupled to the first terminal of the first terminal of the resistive element;

a feedback amplifier having a first input terminal coupled to the first terminal of the resistive element, a second input terminal for receiving the reference voltage, and an output terminal coupled to the control electrode of the first transistor; and a second transistor having a first current electrode coupled to the power supply voltage terminal, a control electrode coupled to the output terminal of the feedback amplifier, and a second current electrode coupled to the input terminal of the comparator for providing the second predetermined input voltage.

18. The buffer circuit of claim 17, wherein the pull-up analog-to-digital converter comprises:

a comparator having an input terminal for receiving the first predetermined input voltage, the comparator for comparing the first predetermined input voltage to the reference voltage and providing a signal of a predetermined logic state in response to the comparator performing a relative magnitude comparison of the first predetermined input voltage to the reference voltage;

a binary counter, coupled to the output terminal of the comparator for receiving the signal, and in response to the signal having a first predetermined logic state, the binary counter counting up to a count value, and in response to the signal having a second predetermined logic state, the binary counter counting down to the count value; and a binary weighted pull-up transistor array, coupled to an output of the binary counter and to a first voltage source, for providing a predetermined voltage in response to receiving the pull-up digital code, the predetermined voltage for adjusting a magnitude of the input voltage until the input voltage is approximately equal to the reference voltage.

19. The buffer circuit of claim 18, further comprising:

a third transistor having a first current electrode coupled to the power supply voltage terminal, a control electrode coupled to the control electrode of the first transistor, and a second current electrode;

a second resistive element having a first terminal coupled to the second current electrode of the third transistor, and a second terminal coupled to the ground terminal;

a fourth transistor having a first current electrode coupled to the power supply voltage terminal, a control electrode, and a second current electrode coupled to the second current electrode of the third transistor;

a second feedback amplifier having a first input terminal coupled to the first terminal of the second resistive element, a second input terminal for receiving the reference voltage, and an output terminal coupled to the control electrode of the fourth transistor;

a fifth transistor having a first current electrode coupled to the power supply voltage terminal, a control electrode coupled to the control electrode of the fourth transistor, and a second current electrode coupled to the input terminal of the comparator of the pull-up analog-to-digital converter for providing the second predetermined input voltage; and a third resistive element having a first terminal coupled to the second current electrode of the fifth transistor, and a second terminal coupled to the ground terminal.

20. The buffer circuit of claim 19, wherein the first, second, third, fourth, and fifth transistors are characterized as being N-channel transistors.

* * * * *